(12) United States Patent
Nedovic et al.

(10) Patent No.: US 8,300,754 B2
(45) Date of Patent: Oct. 30, 2012

(54) CLOCK AND DATA RECOVERY WITH A DATA ALIGNER

(75) Inventors: Nikola Nedovic, San Jose, CA (US); Nestor Tzartzanis, Redwood City, CA (US); William W. Walker, Los Gatos, CA (US); Hirotaka Tamura, Kanagawa (JP)

(73) Assignee: Fujitsu Limited, Kawasaki-shi (JP)

( * ) Notice: Subject to any disclaimer, the term of this patent is extended or adjusted under 35 U.S.C. 154(b) by 701 days.

(21) Appl. No.: 12/510,199

(22) Filed: Jul. 27, 2009

(65) Prior Publication Data

US 2010/0104057 A1  Apr. 29, 2010

Related U.S. Application Data

(60) Provisional application No. 61/084,425, filed on Jul. 29, 2008.

(51) Int. Cl.
*H04L 7/00* (2006.01)
(52) U.S. Cl. ........ 375/355; 375/354; 375/359; 375/371; 400/401; 400/500; 400/501
(58) Field of Classification Search .......... 375/355, 375/354, 359, 371, 375; 713/400, 401, 500, 713/501
See application file for complete search history.

(56) References Cited

U.S. PATENT DOCUMENTS

| | | | |
|---|---|---|---|
| 4,920,278 A | 4/1990 | Nawata | |
| 5,039,889 A | 8/1991 | Janta | |
| 5,343,097 A | 8/1994 | Takeuchi | |
| 6,377,575 B1 | 4/2002 | Mullaney et al. | 370/360 |
| 6,381,291 B1 | 4/2002 | Yom | |
| 6,426,662 B1 | 7/2002 | Arcus | |
| 6,496,077 B2 | 12/2002 | Ahn | |
| 6,545,507 B1 | 4/2003 | Goller | 326/93 |
| 7,012,474 B2 | 3/2006 | Yen | |
| 7,057,435 B2 | 6/2006 | Mahanavelu et al. | 327/261 |
| 7,142,623 B2 | 11/2006 | Sorna | 375/376 |
| 7,265,690 B2 | 9/2007 | Vining | 341/68 |
| 7,286,625 B2 | 10/2007 | Lee et al. | |
| 7,386,084 B2 | 6/2008 | Yin | 375/371 |
| 7,420,870 B2 | 9/2008 | Park et al. | |

(Continued)

FOREIGN PATENT DOCUMENTS

WO 2008/018034 2/2008

OTHER PUBLICATIONS

Office Action for U.S. Appl. No. 12/511,365, Oct. 25, 2011.

(Continued)

*Primary Examiner* — Zewdu Kassa
(74) *Attorney, Agent, or Firm* — Baker Botts L.L.P.

(57) ABSTRACT

In one embodiment, a method includes receiving first and second input streams comprising first and second input data bits, respectively. The method includes generating first and second recovered clocks based on the first and second input streams, respectively. The method includes retiming and demultiplexing the first and second input data bits to generate n first recovered streams and n second recovered streams, respectively, each comprising first and second recovered data bits, respectively. The method further includes determining a phase difference between the first and second recovered clocks; aligning the first recovered data bits with the second recovered data bits based at least in part on a value of n and the phase difference; combining the first and second recovered data bits to generate an output stream; and retiming the first and second recovered data bits in the output stream based on either the first or second recovered clock.

23 Claims, 4 Drawing Sheets

U.S. PATENT DOCUMENTS

| | | |
|---|---|---|
| 7,444,085 B2 | 10/2008 | Ikeuchi |
| 7,446,616 B2 | 11/2008 | Lee |
| 7,489,743 B2 | 2/2009 | Koh et al. |
| 7,535,271 B2 | 5/2009 | Kizer |
| 7,679,453 B2 | 3/2010 | Min |
| 7,737,791 B2 | 6/2010 | Sareen et al. |
| 7,881,419 B2 | 2/2011 | Shin |
| 7,924,071 B2 | 4/2011 | Hiraku |
| 8,058,914 B2 | 11/2011 | Kristensson |
| 8,138,798 B2 | 3/2012 | Nedovic |
| 2002/0131539 A1 | 9/2002 | Li et al. |
| 2003/0189464 A1 | 10/2003 | Drapkin et al. |
| 2003/0198105 A1 | 10/2003 | Yamaguchi |
| 2003/0198311 A1 | 10/2003 | Song et al. |
| 2004/0022339 A1 | 2/2004 | Nakao |
| 2006/0208811 A1 | 9/2006 | Lee |
| 2006/0255866 A1 | 11/2006 | Hirai |
| 2007/0006053 A1 | 1/2007 | Otto |
| 2007/0041486 A1 | 2/2007 | Shin |
| 2007/0047972 A1 | 3/2007 | Ikeuchi |
| 2008/0100364 A1 | 5/2008 | Hiraku |
| 2008/0111634 A1 | 5/2008 | Min |
| 2008/0192873 A1 | 8/2008 | Tamura |
| 2008/0260071 A1 | 10/2008 | Sidiropoulos |
| 2008/0309319 A1 | 12/2008 | Hermann |
| 2009/0009228 A1 | 1/2009 | Jang |
| 2009/0066423 A1 | 3/2009 | Sareen et al. |
| 2009/0125652 A1 | 5/2009 | Huff |
| 2009/0149149 A1 | 6/2009 | Ruijs |
| 2009/0237128 A1 | 9/2009 | Qiao |
| 2010/0085086 A1 | 4/2010 | Nedovic |
| 2010/0086075 A1 | 4/2010 | Parikh |
| 2010/0090723 A1 | 4/2010 | Nedovic |
| 2010/0090733 A1 | 4/2010 | Kristensson |
| 2010/0091925 A1 | 4/2010 | Nedovic |
| 2010/0091927 A1 | 4/2010 | Walker |
| 2010/0119024 A1 | 5/2010 | Shumarayev et al. |
| 2010/0241918 A1 | 9/2010 | Nedovic |
| 2010/0266006 A1 | 10/2010 | Werner et al. ............ 375/232 |

OTHER PUBLICATIONS

SerDes Framer Interface Level 5 Phase 2 (SFI-5.2): Implementation Agreement for *40Gb/s* Interface for Physical Layer Devices, IA# OIF-SFI5-02.0, Oct. 2, 2006.

Hanumolu, P. K. et al., "A Wide-Tracking Range Clock and Data Recovery Circuit", *IEEE JSSC*, 43:2, Feb. 2008.

Lee, J. et al., "A 40-Gb/s Clock and Data Recovery Circuit in O.18-/-tm CMOS Technology", IEEE Journal of Solid-State Circuits, 38:12, Dec. 2003.

Nedovic, N. et al., "A 40-44Gb/s 3x Oversampling CMOS CDR /1:16 DEMUX", ISSCC Digest of Technical Papers.

Staszewski, R. B. et al, "All-Digital TX Frequency Synthesizer and Discrete-Time Receiver for Bluetooth Radio in 130-nm CMOS", *IEEE JSSC*, 39:12, Dec. 2004.

Office Action for U.S. Appl. No. 12/510,211, Aug. 23, 2010.

Office Action for U.S. Appl. No. 12/511,340, Sep. 28, 2010.

Dally, William et al., "Digital Systems Engineering," Cambridge University Press, Cambridge, UK, 2008.

Office Action for U.S. Appl. No. 12/511,352, Oct. 29, 2010.

Office Action for U.S. Appl. No. 12/510,211, Feb. 10, 2011.

Scalable SerDes Framer Interface (SFI-S): Implementation Agreement for Interfaces beyond 40G for Physical Layer Devices, IA# OIF-SFI-S-01.0, Nov. 2008.

Von Bueren, George et al, "5.75 to 44Gb/s Quarter Rate CDR with Data Rate Selection in 90nm Bulk CMOS," 34th European Solid-State Circuits Conference, ESSCIRC, 2008.

Savoj, Jafar et al., "Design of Half-Rate Clock and Data Recovery Circuits for Optical Communication Systems," Proceedings of Design Automation Conference, 2001.

Nedovic, N., U.S. Appl. No. 13/424,728, USPTO, Patent Application filed Mar. 20, 2012, *Symmetric Phase Detector*.

Nedovic, N., U.S. Appl. No. 12/510,211, USPTO, Amendment after non-fmal Office Action filed Dec. 2, 2010.

Nedovic, N., U.S. Appl. No. 12/510,211, USPTO, Notice of Appeal and Pre-Brief Appeal filed Jun. 8, 2011.

Nedovic, N., U.S. Appl. No. 12/510,211, USPTO, Appeal Brief filed Sep. 6, 2011.

Nedovic, N., U.S. Appl. No. 12/510,211, USPTO, Examiner's Answer to Appeal Brief dated Nov. 10, 2011.

Nedovic, N., U.S. Appl. No. 12/510,211, USPTO, Reply Brief filed Jan. 9, 2012.

Nedovic, N., U.S. Appl. No. 12/511,340, USPTO, Amendment after non-final Office Action filed Dec. 28, 2010.

Nedovic, N., U.S. Appl. No. 12/511,340, USPTO, Notice of Allowance dated Jan. 19, 2012.

Nedovic, N., U.S. Appl. No. 12/511,352, USPTO, Amendment after non-final Office Action filed Feb. 8, 2011.

Nedovic, N., U.S. Appl. No. 12/511,352, USPTO, Notice of Allowance dated Aug. 23, 2011.

Walker, W.., U.S. Appl. No. 12/511,365, USPTO, Amendment after non-final Office Action filed Jan. 20, 2012.

Walker, W., U.S. Appl. No. 12/511,365, USPTO, Supplemental Amendment to Office Action filed Mar. 5, 2012.

Walker, W., U.S. Appl. No. 12/511,365, USPTO, Non-final Office Action dated Mar. 29, 2012.

Parikh, S., U.S. Appl. No. 12/511,917, USPTO, Non-final Office Action dated May 29, 2012.

Nedovic, N., U.S. Appl. No. 13/424,728, USPTO, Non-final Office Action dated Apr. 26, 2012.

USPTO Notice of Allowance and Fees Due for U.S. Appl. No. 12/728,756.

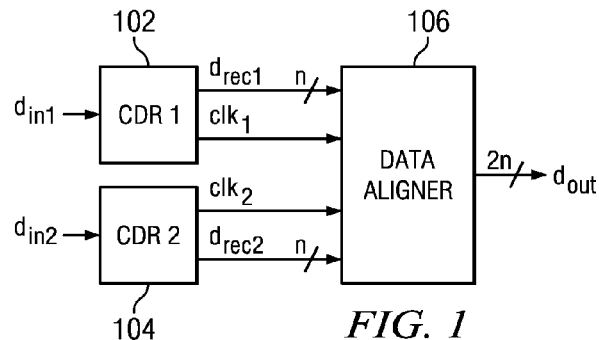
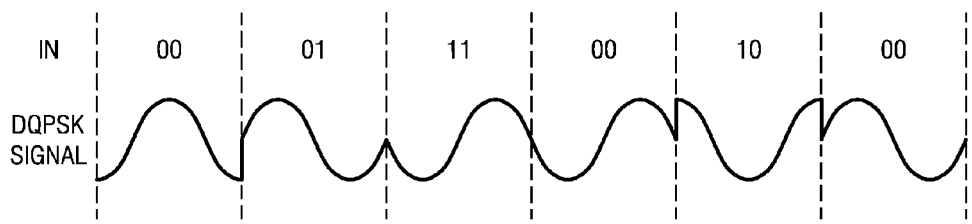
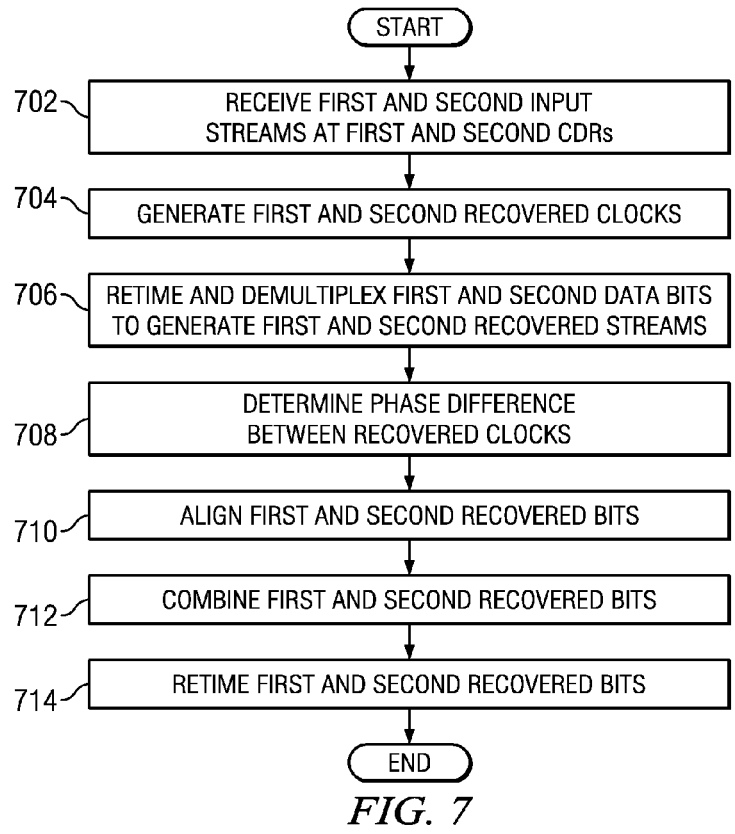

CLOCK AND DATA RECOVERY WITH A DATA ALIGNER

RELATED APPLICATION

This application claims the benefit, under 35 U.S.C. §119 (e), of U.S. Provisional Patent Application No. 61/084,425, entitled Clock and Data Recovery Circuit with Data Aligner, filed 29 Jul. 2008.

TECHNICAL FIELD

The present disclosure relates generally to clock and data recovery (CDR).

BACKGROUND

CDR circuits (or systems) are generally used to sample an incoming data signal, extract the clock from the incoming data signal, and retime the sampled data. A phase-locked loop (PLL)-based CDR circuit is a conventional type of CDR circuit. By way of example, in a conventional PLL based CDR, a phase detector compares the phase between input data bits from a serial input data stream and a clock signal from a voltage-controlled oscillator (VCO). In response to the phase difference between the input data and the clock, the phase detector generates signals UP and DN. A charge pump drives a current to or from a loop filter according to the UP and DN signals. The loop filter generates a control voltage $V_{CTRL}$ for the VCO based on the UP and DN signals. The loop acts as a feedback control system that tracks the phase of input data stream with the phase of the clock that the loop generates. The dynamics of the loop are generally determined by the open loop gain and the location of open loop zeroes and poles (predominantly in the loop filter).

A problem in systems employing conventional CDR architectures utilizing two CDRs for use in demodulated differential quadrature phase shift keying (DQPSK) modulated data streams is that they are suitable only for full-rate CDRs without data demultiplexing, when the frequencies of the clocks within each CDR are the same as the data rate of the input data bit streams. Otherwise, there exists an uncertainty of relative clock and data phases from the two CDRs and the circuit may operate erroneously. However, many practical CDRs in high speed optical communications use either half-rate or quarter-rate architectures; that is, each CDR may use a clock whose frequency is half (half-rate), a quarter (quarter-rate), or a smaller fraction of the rate of input data stream, in order to cope with high input data rates.

BRIEF DESCRIPTION OF THE DRAWINGS

FIG. 1 illustrates an example system employing a CDR architecture that includes two independent CDRs and a data aligner.

FIG. 2 illustrates an example DQPSK modulation scheme.

FIG. 7 illustrates an example method for CDR with a data aligner.

DESCRIPTION OF EXAMPLE EMBODIMENTS

Figure 3:
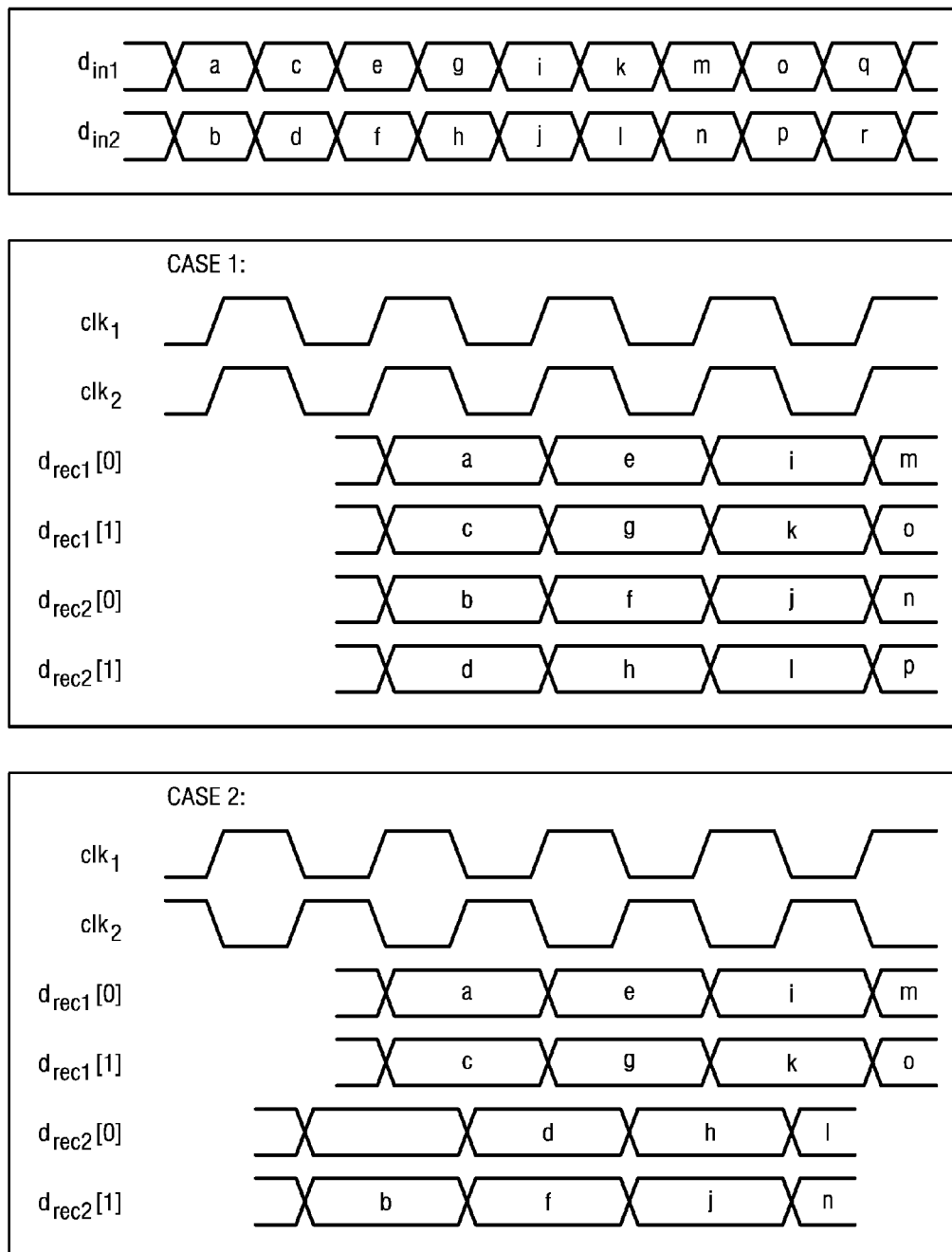
FIG. 3 illustrates example phase relationships among recovered clocks and data streams.

Particular embodiments relate to an electronic circuit for clock and data recovery (CDR) for a two or more bits per symbol serial communication system. More particularly, the present disclosure provides examples of a CDR architecture that takes two input data bit streams and produces one or more output data bit streams in which the bits from the two input data bit streams are interleaved. In particular embodiments, the two input bit streams have the same data rate and limited relative phase (e.g., within limits of ±UI/2). An example CDR architecture may include two independent CDRs, one for each of two input data streams, as well as a data aligner, which combines the data outputs from the two CDRs into one or more output data streams using the clock recovered by one of the CDRs. (In particular embodiments, one stream may refer to one wire, and vice versa, where appropriate). Particular embodiments further relate to the use of CDRs having less than full-rate architecture. More specifically, particular embodiments utilize CDRs that employ half-rate or quarter-rate architecture. Generally, particular embodiments can be used for any two-input CDR application.

By way of example, particular embodiments relate to the use of a CDR architecture within a deserializer utilized in optical communication. By way of example, particular embodiments may be utilized in a DQPSK transponder. However, alternative embodiments may be utilized in other specific applications and for non-optical communication (e.g., hard-wired communication using electrons), where appropriate. Particular embodiments may be utilized in high speed communication systems (e.g., data rates greater than 10 Gb/s) and in even more particular embodiments, in communication systems having data rates at or exceeding 40 Gb/s. Particular embodiments may be implemented with a complementary metal oxidesemiconductor (CMOS) architecture. Particular embodiments may also provide reduced power consumption.

FIG. 1 illustrates an example CDR architecture 100. CDR architecture 100 includes a first CDR circuit 102 and a second CDR circuit 104 each of which may include one or more modules or subcircuits. CDR circuit 102 is configured to receive first input data bits from a first input data bit stream $d_{in1}$ while CDR circuit 104 is configured to receive second input data bits from a second input data bit stream $d_{in2}$. In particular embodiments, each of the first and second input data bit streams $d_{in1}$ and $d_{in2}$ is sampled from a symbol stream and each includes input data bits sampled at an input frequency.

The present disclosure contemplates the use of any suitable CDR to implement CDR 102 or CDR 104. Furthermore, in particular embodiments, CDRs 102 and 104 may perform independently from one another. In particular embodiments, each CDR is a half-rate 20 Gb/s CDR. A single channel CDR block may consist of a 10 GHz quadrature VCO, four 10 Gb/s samplers, a 10 Gb/s synchronizer, a 4:8 10 Gb/s-to-5 Gb/s DEMUX, a clock divider that supplies 4-phase 5 GHz clock, a phase detector (PD), and charge pump (CP) that run at 5 Gb/s, a loop filter, and a frequency acquisition circuit. In particular embodiments, the samplers operate at half data rate and produce four 10 Gb/s samples, each synchronized to the VCO phase used to clock the sampler. The Synchronizer block may operate at 10 Gb/s and generally serves two purposes: to synchronize the 10 Gb/s samples to the common reference (VCO phase 0), and to generate static 10 Gb/s signals from the sampler outputs, which are invalid (reset) half of the cycle due to a particular implementation of the preceding sampler. The clock frequency divider and the 10 Gb/s-to-5 Gb/s DEMUX generate the 8×5 Gb/s static CMOS bits from the 4×10 Gb/s CML bits from the Synchronizer. The PD runs at 5 Gb/s, and generates up and dn signals for the CP, which drives the loop filter and generates the control voltage Vctrl to the VCO.

In particular embodiments, the symbol stream is a differential quadrature phase shift keying (DQPSK) modulated data stream. By way of example and not by way of limitation, the first input data bits from the first input data bit stream $d_{in1}$ may be even-numbered bits from the symbol stream while the second input data bits from the second input data bit stream $d_{in2}$ may be odd-numbered bits from the symbol stream. By way of reference, DQPSK is a modulation scheme in which two bits at a time are grouped and used to phase-modulate an output. By way of example, in an example implementation, 2 bits per symbol are encoded in the phases of light. The modulation is differential, which means that the input symbol (two bits) corresponds not to a particular phase of the output, but to the change of the phase relative to the phase of the previous symbol. FIG. 2 illustrates an example DQPSK modulation scheme. In the example illustrated in FIG. 2, symbol 00 causes zero change in the output phase, symbol 01 causes a phase change of $\pi/2$, symbol 11 causes a phase change of $\pi$, and symbol 10 causes a phase change of $3\pi/2$. In this way the demodulation may be made insensitive to a phase shift in the communication medium.

A DQPSK receiver demodulates the DQPSK symbol stream to obtain two bits per symbol, and thus two streams of binary data, $d_{in1}$ and $d_{in2}$, which may then be amplified and sent to CDRs 102 and 04, respectively. The two input data streams $d_{in1}$ and $d_{in2}$ have the same data rate, but the exact phase relationship is unknown (within limits of $\pm UI/2$ where UI is the unit interval) due to mismatches in the paths from the demodulator to respective CDR 102 or 104. A proper clock and data recovery circuit should not only recover the clock and individual data, but also correctly recombine the two streams.

CDR 102 generates a first recovered clock $clk_1$ based on the first input data stream $d_{in1}$. Similarly, CDR 104 generates a second recovered clock $clk_2$ based on the second input data stream $d_{in2}$. In particular embodiments, one or both of the recovered clocks $clk_1$ and $clk_2$ are then transmitted to a data aligner 106, which may include one or more modules or subcircuits.

In particular embodiments, CDR 102 also retimes and demultiplexes the data bits from the first input data bit stream $d_{in1}$. By way of example, CDR 102 may perform 1:n demultiplexing ($n \geq 1$, usually $n=2^k$, where $k=0, 1, 2 \ldots$). That is, CDR 102 may demultiplex corresponding input data bit stream $d_{in1}$ into n recovered streams. Demultiplexing is advantageous in particular embodiments utilized in high speed communication systems. By demultiplexing the input data bit stream $d_{in1}$, the data is easier to handle. Conventionally, it is difficult to design a circuit that can recover a full-rate clock at high speed. By way of example, a high speed data rate may be considered a data rate greater than or equal to 1 Gb/s, or greater than 10 Gb/s, or greater than 20 Gb/s, or greater than 40 Gb/s.

In particular embodiments, n is greater than or equal to 2 and the data bits in each first recovered data bit stream $d_{rec1}$ are output from CDR 102 at a first demultiplexed frequency that is the same for each first recovered data bit stream $d_{rec1}$ and that is less than the input frequency. Likewise, in particular embodiments, CDR 104 also retimes and demultiplexes the data bits from the second input data bit stream $d_{in2}$ to generate m second recovered data bit streams $d_{rec2}$ each output at a second demultiplexed frequency that is less than the input frequency. In particular embodiments, the value of m is equal to the value of n and the first demultiplexed frequency equals the second demultiplexed frequency. In the following description, the value of m is assumed to equal the value of n and the first demultiplexed frequency is assumed to be equal to the second demultiplexed frequency (and thus FIG. 1 illustrates n second recovered streams $d_{rec2}$).

In a particular embodiment, each CDR operates independently of the other and demultiplexes the recovered data to 5 Gb/s. The first and second recovered data bit streams $d_{rec1}$ and $d_{rec1}$ are then sent to data aligner 106. In particular embodiments, data aligner 106 operates off one, and only one, of the clocks, $clk_1$ or $clk_2$, recovered from one of the input streams $d_{in1}$ or $d_{in2}$, respectively, by corresponding CDR 102 or 104. In particular embodiments, data aligner 106 detects/determines a phase difference between the first and second recovered clocks $c_{lk1}$ and $c_{lk2}$. Data aligner 106 may then retime and align the first recovered bits $d_{rec1}[n-1:0]$ from the n first recovered data bit streams $d_{rec1}$ with the second recovered bits $d_{rec2}[n-1:0]$ from the n second recovered data bit streams $d_{rec2}$ based at least in part on the value of n and the determined phase difference. In particular embodiments, data aligner 106 then combines the first recovered bits $d_{rec1}[n-1:0]$ from the n first recovered data bit streams $d_{rec1}$ with the second recovered bits $d_{rec1}[n-1:0]$ from the n second recovered data bit streams $d_{rec2}$ to generate at least one or more output data bit streams. In particular embodiments, data aligner 106 generates 2n output data bit streams $d_{out}[2n-1:0]$. It should be appreciated that the foregoing may be performed on a continuous basis during operation of CDR architecture 100.

While demultiplexing makes the data in the input data bit streams easier to handle, demultiplexing also results in a new problem as evidenced in the following. In the general case in which n=1 (full rate CDR), data aligner 106 only needs to synchronize the bits from the two recovered streams $d_{rec1}$ and $d_{rec2}$ recovered by CDRs 102 and 104 to the common chosen clock, $clk_1$ or $clk_2$, and interleave these data bits from the two recovered streams to produce output streams $d_{out}[2n-1:0]$. However, when the input data bit streams $d_{in1}$ and $d_{in2}$ are demultiplexed (e.g., n=2, 4, 8, 16, . . . ), there exists an uncertainty in the relative phase of the recovered clocks, $clk_1$ and $clk_2$, and the recovered data bit streams, $d_{rec1}$ and $d_{rec2}$, output from CDRs 102 and 104 due at least in part to the random nature of the process of CDR phase locking and/or clock frequency division typically used for the demultiplexing.

By way of example, if the input phases are identical and the CDRs utilize half-rate architecture (the frequency of the internally generated clocks used to sample the input data bit streams $d_{in1}$ and $d_{in2}$ is half of the data rate), the recovered clocks, $clk_1$ and $clk_2$, may be either approximately in phase (case 1, disregarding non-idealities for the moment), or approximately out of phase (case 2, $\pm 180°$ phase difference), as shown in FIG. 3, which illustrates phase relationships among recovered clocks $c_{lk1}$ and $c_{lk2}$ and data streams $d_{in1}$, $d_{in2}$, $d_{rec1}[0]$ (first first recovered data bit stream), $d_{rec1}[1]$ (second first recovered data bit stream), $d_{rec2}[0]$ (first second recovered data bit stream), and $d_{rec2}[1]$ (second second recovered data bit stream).

Accordingly, the recovered bits from the first recovered data bit streams $d_{rec1}$ from CDR 102 may be in phase or out of phase with the recovered bits from the second recovered data bit streams $d_{rec2}$ from CDR 104. Either of the two cases (case 1 or case 2) may happen due to, by way of example, differences between the initial states of CDRs 102 and 104, mismatches between the CDR components, or different input patterns at $d_{in1}$ and $d_{in2}$. Without loss of generality, it is assumed that the least significant bit (LSB) (bit 0) in a demultiplexed data stream corresponds to the earliest bit in the input stream, and that the most significant bit (MSB) corresponds to the latest bit. To correctly combine the recovered data streams $d_{rec1}$ and $d_{rec2}$ from CDRs 102 and 104, data aligner 106 must detect which of the two cases (n cases in general) occurred. Data aligner 106 determines which of the n cases occurred or is occurring by detecting the phase difference between the recovered clocks $clk_1$ and $clk_2$.

In particular embodiments, in which n=2, only two phases (one from each CDR) are compared. Assuming for sake of eased visualization that the bits in the original symbol stream are ordered according to the alphabet, e.g., a, b, c, d, e, f, g, h, i, j, k, l, m, n, o, p, . . . , and the bits in each input data bit stream $d_{in1}$ and $d_{in2}$ are as shown in FIG. 3, then the bits in each of the streams $d_{rec1}[0]$, $d_{rec1}[1]$, $d_{rec2}[0]$, and $d_{rec2}[1]$ are as shown in FIG. 3 for each of the two cases: case 1 ($c_{lk1}$ in phase with $c_{lk2}$) and case 2 ($c_{lk1}$ out of phase with respect to $c_{lk2}$). Assuming case 1, to generate 2n output streams $d_{out}$ that together are a proper reconstruction of the original symbol stream, data aligner 106 inserts (into the output streams) a first bit of the first first recovered data bit stream $d_{rec1}[0,0]$ followed by a first bit of the first second recovered data bit stream $d_{rec2}[0,0]$ followed by a first bit of the second first recovered data bit stream $d_{rec1}[1,0]$ followed by a first bit of the second second recovered data bit stream $d_{rec2}[1,0]$, which would then be followed by a second bit of the first first recovered data bit stream $d_{rec1}[0,1]$ followed by a second bit of the first second recovered data bit stream $d_{rec2}[0,1]$ followed by a second bit of the second first recovered data bit stream $d_{rec1}[1,1]$ followed by a second bit of the second second recovered data bit stream $d_{rec2}[1,1]$, and so on.

Assuming case 2, in particular embodiments, to generate the 2n output streams $d_{out}$ that together are a proper reconstruction of the original symbol stream, data aligner 106 inserts (into the output streams) a first bit of the first first recovered data bit stream $d_{rec1}[0,0]$ followed by a delayed first bit of the first second recovered data bit stream $d_{rec2}[0,0]$ followed by a first bit of the second first recovered data bit stream $d_{rec1}[1,0]$ followed by a first bit of the second second recovered data bit stream $d_{rec2}[1,0]$, which would then be followed by a second bit of the first first recovered data bit stream $d_{rec1}[0,1]$ followed by a delayed second bit of the first second recovered data bit stream $d_{rec2}[0,1]$ followed by a second bit of the second first recovered data bit stream $d_{rec1}[1,1]$ followed by a second bit of the second second recovered data bit stream $d_{rec2}[1,1]$, and so on.

Figure 4:
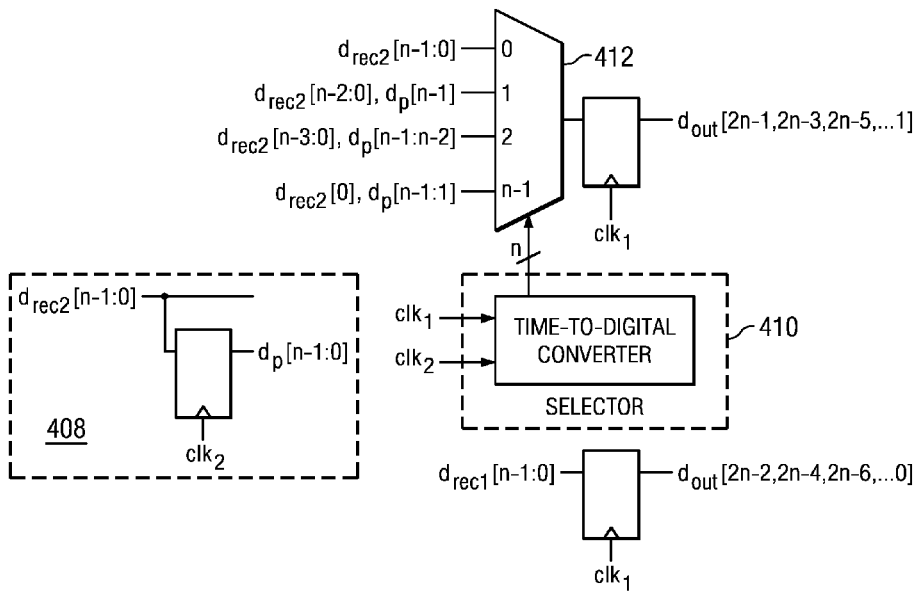
FIG. 4 illustrates an example data aligner.

FIG. 4 illustrates a schematic of an example data aligner 106. Data aligner 106 includes a shifter 408 that generates delay recovered data from CDR 104, a selector 410, which in particular embodiments is a time-to-digital converter that converts the phase offset between the recovered clocks $clk_1$ and $clk_2$ to a digital code, and a multiplexer (MUX) 412 that selects the appropriate shift/delay combination of the input. The output of MUX 412 in FIG. 4 is in phase with $clk_2$, and thus it should be synchronized with $clk_1$. Any suitable method for the required synchronization may be used. In particular embodiments, additional manipulation is performed on $d_{rec2}$[n-1:0] and $d_p$[n-1:0] prior to multiplexing, such as demultiplexing with divided $clk_1$ or $clk_2$.

Selector (e.g., time-to-digital converter) 410 may be implemented in various ways. By way of example, in particular embodiments, time-to-digital converter 410 may be implemented as a Vernier Delay Line (VDL) or a delay locked loop (DLL). The conversion table assumed for FIG. 4 is shown in Table 1 provided below. In particular embodiments, the conversion table may be constructed differently than that shown in Table 1 as long as the one-to-one correspondence between the input phase difference and the selected data is preserved.

TABLE 1

Conversion table of the time-to-digital converter

| Input phase difference $\Delta\phi = \phi(c1k_2) - (\phi(c1k_1)$[rad] | Digital code |
| --- | --- |
| $-2\pi/n \leq \Delta\phi < 2\pi/n$ | 0 |
| $2\pi/n \leq \Delta\phi < 6\pi/n$ | 1 |
| $6\pi/n \leq \Delta\phi < 10\pi/n$ | 2 |
| . . . | . . . |
| $-2\pi*(n-3)/n \leq \Delta\phi < 2\pi*(n-1)/n$ | n − 1 |

Figure 5:
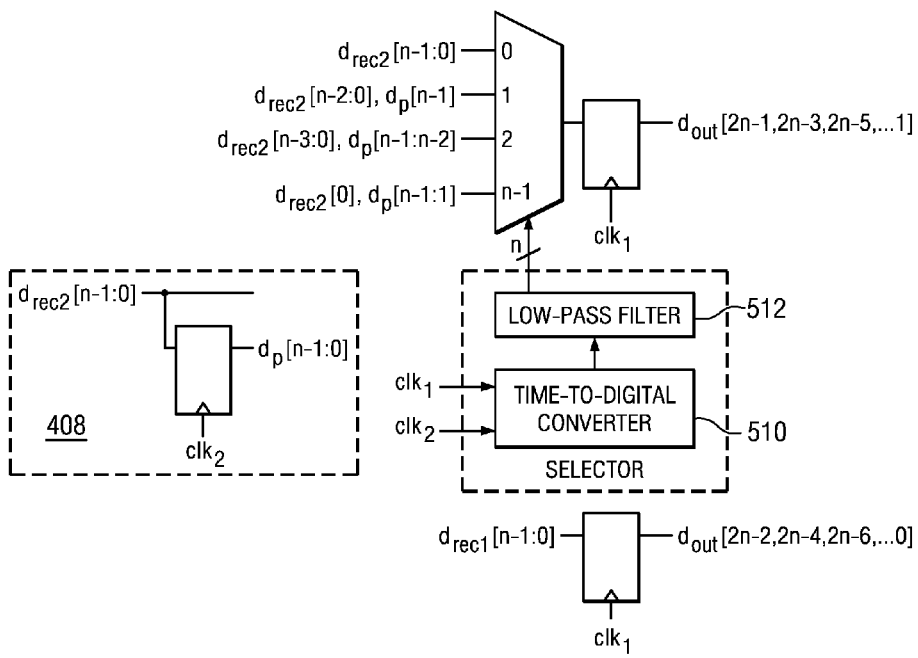
FIG. 5 illustrates another example of a data aligner.

FIG. 5 illustrates another example data aligner. The data aligner may be similar to data aligner 106 described with reference to FIG. 4, except for the generation of the multiplexer select signal. In FIG. 5, the output of time-to-digital converter 510 is brought to a low-pass filter 512, which averages the decision on which data order is selected. This structure is generally useful when the offset between the inputs to CDRs 102 and 104, $d_{in1}$ and $d_{in2}$ respectively, is comparable to UI/2, such that the output of time-to-digital converter 510 can be corrupted by noise or circuit non-idealities. In particular embodiments, low pass filter 512 reduces the effect of jitter peaking, which may cause the instantaneous phase difference between the recovered clocks $clk_1$ and $clk_2$ to be considerably different than the phase difference between the data inputs $d_{in1}$ and $d_{in2}$. In particular embodiments, to prevent jitter peaking from causing erroneous data alignment, the bandwidth of filter 512 must be lower than the bandwidth of CDR 102 and CDR 104.

In particular embodiments, low pass filter 512 may be either analog or digital. In particular embodiments, an analog filter generally requires an A/D converter at the output and, depending on the interface between time-to-digital converter 510 and low-pass filter 512, possibly a D/A converter at the input. If n=2, the D/A converter at the input is generally not necessary, and an A/D converter may be implemented as a 1-bit comparator. Note that A/D and D/A converters have modest performance requirements as they operate at a speed comparable to the loop bandwidth; that is, by way of example, a few tens of megahertz even for the fastest gigabit links.

Figure 6:
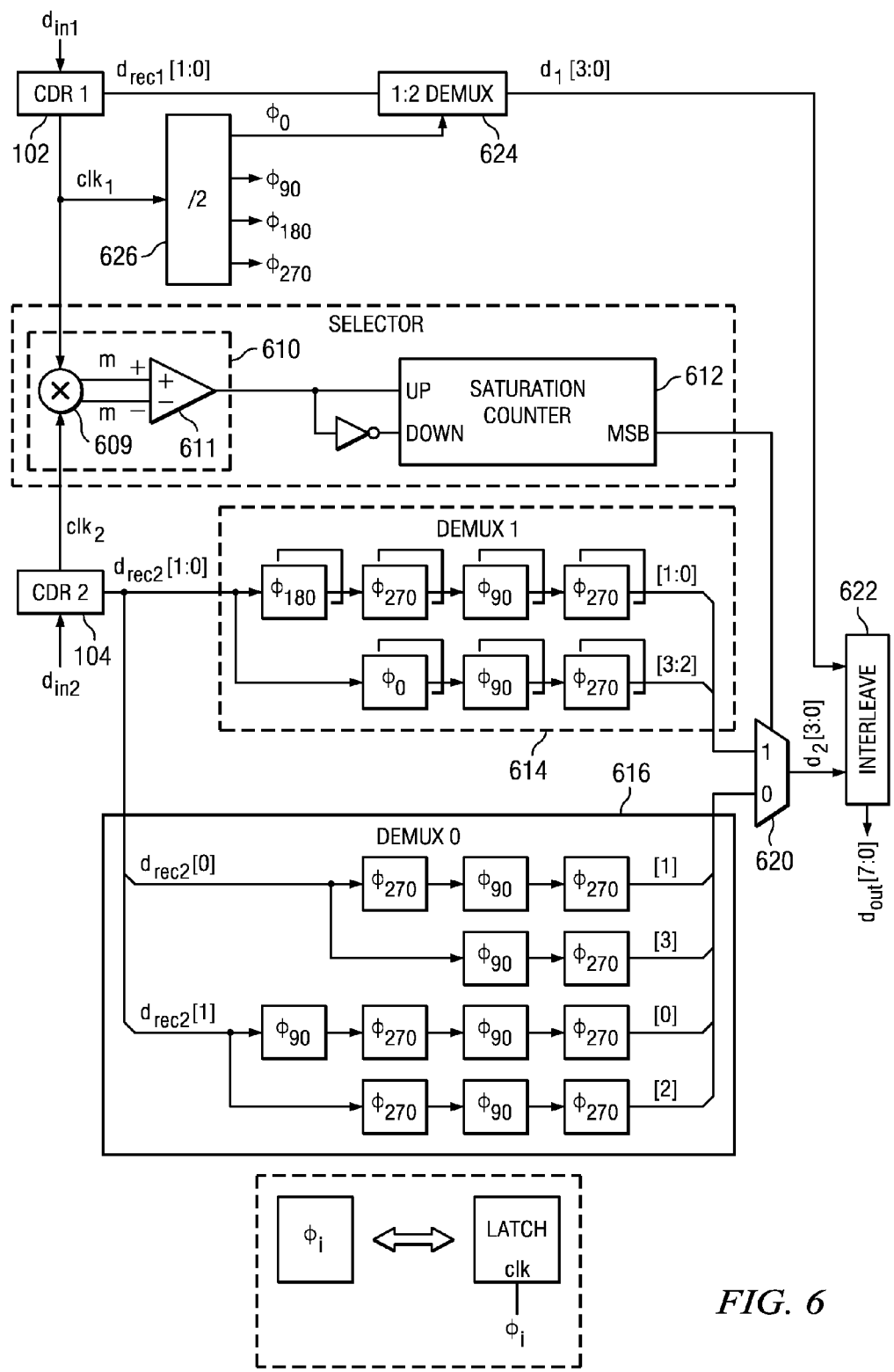
FIG. 6 illustrates another example of a data aligner.

FIG. 6 illustrates another example data aligner. The embodiment illustrated in FIG. 6 may be considered a special case of the embodiment illustrated in FIG. 5 in which n=2, a time-to-digital converter 610 is implemented as a mixer 609 followed by a comparator 611 (1-bit A/D converter), and low-pass filter 612 is implemented as a saturation counter. Prior to multiplexing, data from CDR 102 and/or 104 may be demultiplexed using $clk_1$ frequency-divided by two as a reference. The demultiplexers also serve to retime $d_{rec2}[1:0]$ to $clk_1$. DEMUX 614 retimes and demultiplexes $d_{rec2}[1:0]$ assuming that the recovered clocks $clk_1$ and $clk_2$ are in phase (case 1 in FIG. 3). DEMUX 616 retimes and demultiplexes $d_{rec2}[1:0]$ assuming that the recovered clocks $clk_1$ and $clk_2$ are out of phase (case 2 in FIG. 3). In addition to demultiplexing, DEMUXes 614 and 616 also retime $d_{rec2}$ to the clock $clk_1$, and appropriately delay bits of $d_{rec2}$ in case 0 (DEMUX 0). The output of CDR 104 is synchronized to the phase 90/270 of divided-by-2 clock $clk_1$.

The detection of which case occurred and selection between the outputs of DEMUX 614 and DEMUX 616 is based on selector block 618. The phase difference is detected with mixer 609, which, driven by the signals of equal frequency, outputs a positive value ($m_+>m_-$) when the inputs are in-phase within $\pm\pi/2$, and outputs a negative value ($m_+<m_-$) when the inputs are out of phase within $\pm\pi/2$. The output of mixer 609 is taken to comparator 611 (1-bit A/D converter) and then to an up/dn input to saturation counter 612, as shown in FIG. 6. The counter 612 is sized so that it takes more time to flip its MSB output than the reciprocal of the jitter peaking frequency (around loop bandwidth of CDR 102 and CDR 104). The MSB output of the counter 612 is the select signal for the multiplexer 620.

In one particular embodiment, the output of CDR 102, $d_{rec1}[1:0]$, is demultiplexed with a 1:2 demultiplexer 624. The clock input to this 1:2 demultiplexer 624 may be received from frequency divider 626. The output of this 1:2 demultiplexer 624, $d_1[3:0]$ may then be interleaved with the output of the multiplexer 620, $d_2[3:0]$. Interleaver 622 shown in FIG. 6 involves no physical circuit, and it only designates that $d_{rec1}$ and $d_{rec2}$ are combined in the output bus $d_{out}$ in the way that $d_{rec1}[0]$ becomes $d_{out}[0]$, $d_{rec2}[0]$ becomes $d_{out}[1]$, $d_{rec1}[1]$ becomes $d_{out}[2]$, ... $d_{rec2}[3]$ becomes $d_{out}[7]$. As noted earlier, it was assumed that bit 0 (LSB) is a demultiplexed version of the earliest input bit to the CDR, and MSB is the demultiplexed version of the latest bit.

FIG. 7 illustrates an example method for CDR with a data aligner. The method begins at step 702, where first and second input streams comprising first and second input data bits, respectively, are received at an input frequency at first and second independent CDRs, respectively. At step 704, the first and second CDRs generate first and second recovered clocks based on the first and second input streams, respectively. At step 706, the first and second CDRs retime and demultiplex the first and second input data bits to generate n first recovered streams and m (where n is generally equal to m) second recovered streams, respectively, each comprising first and second recovered data bits, respectively. At step 708, a data aligner determines a phase difference between the first and second recovered clocks. At step 710, the data aligner aligns the first recovered data bits with the second recovered data bits based at least in part on a value of n and the phase difference. At step 712, the data aligner combines the first and second recovered data bits to generate 2n output streams. At 714, the data aligner retimes the first and second recovered data bits in the output stream based on either the first or second recovered clock, at which point the method ends. Particular embodiments may continuously repeat the steps of the method of FIG. 7, according to particular needs. Although the present disclosure describes and illustrates particular steps of the method of FIG. 7 as occurring in a particular order, the present disclosure contemplates any suitable steps of the method of FIG. 7 occurring in any suitable order. Moreover, although the present disclosure describes and illustrates particular components carrying out particular steps of the method of FIG. 7, the present disclosure contemplates any suitable combination of any suitable components carrying out any suitable steps of the method of FIG. 7.

The present disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend.

By way of example, although a data aligner that combines recovered streams from two independent CDRs based on one clock recovered from one of the CDRs has been described, it should be appreciated that, in alternate embodiments, the data aligner may combine recovered streams from three, four, or more CDRs using, for example, one clock recovered from one of the CDRs.

The invention claimed is:

1. A method comprising:
at a first clock and data recovery (CDR) circuit:
receiving a first input data stream comprising first input data bits at an input frequency, the first input data stream having been sampled from a symbol stream;
generating a first recovered clock based on the first input data stream; and
retiming and demultiplexing the first input data bits from the first input data stream to generate n first recovered data streams each comprising first recovered data bits at a first divided clock having a first divided clock frequency that is less than the input frequency;
at a second CDR circuit:
receiving a second input data stream comprising second input data bits at the input frequency, the second input data stream having been sampled from the symbol stream;
generating a second recovered clock based on the second input data stream; and
retiming and demultiplexing the second input data bits from the second input stream to generate n second recovered data streams each comprising second recovered data bits at a second divided clock having a second divided clock frequency that is less than the input frequency;
determining a phase difference between the first recovered clock and the second recovered clock;
aligning the first recovered data bits from the first recovered data streams with the second recovered data bits from the second recovered data streams based at least in part on:
a value of n; and
the phase difference;
combining the first recovered data bits from the first recovered data streams with the second recovered data bits from the second recovered data streams to generate one or more output data streams; and
retiming the first and second recovered data bits in the one or more output data streams based on either the first recovered clock or the second recovered clock.

2. The method of claim 1, wherein:
generating the first recovered clock at the first CDR circuit is independent from generating the second recovered clock at the second CDR circuit; and
generating the second recovered clock at the second CDR circuit is independent from generating the first recovered clock at the first CDR circuit.

3. The method of claim 1, wherein:
retiming and demultiplexing at the first CDR is independent from retiming and demultiplexing at the second CDR; and
retiming and demultiplexing at the second CDR is independent from retiming and demultiplexing at the first CDR circuit.

4. The method of claim 1, wherein there are 2n output data streams.

5. The method of claim 1, wherein:
the value of n is 2;
there being two first recovered data streams and two second recovered data streams:
the two first recovered data streams comprising a first first recovered data stream of first first recovered data bits and a second first recovered data stream of second first recovered data bits; and
the two second recovered data streams comprising a first second recovered data stream of first second recovered data bits and a second second recovered data stream of second second recovered data bits; there being a total of four recovered data streams.

6. The method of claim 5, wherein:
the first recovered clock comprises a first recovered clock frequency;
the second recovered clock comprises a second recovered clock frequency;
the first recovered clock frequency is approximately half the input frequency; and
the second recovered clock frequency is approximately half the input frequency.

7. The method of claim 5, wherein:
there are 4 output data streams;
determining the phase difference comprises determining whether the first recovered clock is in phase or out of phase with the second recovered clock, the first recovered clock being out of phase with the second recovered clock if the first recovered clock is approximately 180° from the second recovered clock; and
combining the first recovered data bits from the first recovered data streams with the second recovered data bits from the second recovered data streams to generate the one output data stream comprises:
if the first recovered clock is in phase with the second recovered clock inserting into the output data streams a first first recovered data bit, immediately followed by a first second recovered data bit, immediately followed by a second first recovered data bit, immediately followed by a second second recovered data bit, and so on without delaying the insertion of any of the recovered data bits into the output data stream;
if the first recovered clock is out of phase with the second recovered clock, inserting into the output data streams a first first recovered data bit, immediately followed by a first second recovered data bit, immediately followed by a second first recovered data bit, immediately followed by a second second recovered data bit, and so on with the insertion of one or more of the recovered data bits into the output data stream being delayed to ensure insertion of the recovered data bits into the output data stream in an order corresponding to the symbol stream.

8. The method of claim 1, wherein:
the first input data bits are even-numbered bits from the symbol stream; and
the second input data bits are odd-numbered bits from the symbol stream.

9. The method of claim 1, wherein the symbol stream is a differential quadrature phase shift keying (DQPSK) modulated data stream.

10. The method of claim 1, wherein the first and second input data streams comprise differential data streams.

11. The method of claim 1, further comprising one or more additional CDR circuits in addition to the first and second CDR circuits.

12. A system comprising:
a first clock and data recovery (CDR) circuit configured to:
receive a first input data stream comprising first input data bits at an input frequency, the first input data stream having been sampled from a symbol stream;
generate a first recovered clock based on the first input data stream; and
retime and demultiplex the first input data bits from the first input data stream to generate n first recovered data streams each comprising first recovered data bits at a first divided clock having a first divided clock frequency that is less than the input frequency;
a second CDR circuit configured to:
receive a second input data stream comprising second input data bits at the input frequency, the second input data stream having been sampled from the symbol stream;
generate a second recovered clock based on the second input data stream; and
retime and demultiplex the second input data bits from the second input stream to generate n second recovered data streams each comprising second recovered data bits at a second divided clock having a second divided clock frequency that is less than the input frequency; and
a data aligner configured to:
determine a phase difference between the first recovered clock and the second recovered clock;
align the first recovered data bits from the first recovered data streams with the second recovered data bits from the second recovered data streams based at least in part on:
a value of n; and
the phase difference;
combine the first recovered data bits from the first recovered data streams with the second recovered data bits from the second recovered data streams to generate one or more output data streams; and
retime the first and second recovered data bits in the one or more output data streams based on either the first recovered clock or the second recovered clock.

13. The system of claim 12, wherein:
the first CDR circuit is configured to generate the first recovered clock independent from the second CDR circuit; and
the second CDR circuit is configured to generate the second recovered clock independent from the first CDR circuit.

14. The system of claim 12, wherein:
the first CDR circuit is configured to retime and demultiplex the first input data bits independent from the second CDR; and
the second CDR circuit is configured to retime and demultiplex the second input data bits independent from the first CDR.

15. The system of claim 12, wherein there are 2n output data streams.

16. The system of claim 12, wherein:
the value of n is 2;
there being two first recovered data streams and two second recovered data streams:
the two first recovered data streams comprising a first first recovered data stream of first first recovered data bits and a second first recovered data stream of second first recovered data bits; and
the two second recovered data streams comprising a first second recovered data stream of first second recovered data bits and a second second recovered data stream of second second recovered data bits;
there being a total of four recovered data streams.

17. The system of claim 16, wherein:
the first recovered clock comprises a first recovered clock frequency;
the second recovered clock comprises a second recovered clock frequency;
the first recovered clock frequency is approximately half the input frequency; and the second recovered clock frequency is approximately half the input frequency.

18. The system of claim 16, wherein:
there 4 output data streams;
in order to determine the phase difference, the data aligner is configured to determine whether the first recovered clock is in phase or out of phase with the second recovered clock, the first recovered clock being out of phase with the second recovered clock if the first recovered clock is approximately 180° from the second recovered clock; and
in order to combine the first recovered data bits from the first recovered data streams with the second recovered data bits from the second recovered data streams to generate the one output data stream, the data aligner is configured to:
if the first recovered clock is in phase with the second recovered clock insert into the output data streams a first first recovered data bit, immediately followed by a first second recovered data bit, immediately followed by a second first recovered data bit, immediately followed by a second second recovered data bit, and so on without delaying the insertion of any of the recovered data bits into the output data stream;
if the first recovered clock is out of phase with the second recovered clock, insert into the output data streams a first first recovered data bit, immediately followed by a first second recovered data bit, immediately followed by a second first recovered data bit, immediately followed by a second second recovered data bit, and so on with the insertion of one or more of the recovered data bits into the output data stream being delayed to ensure insertion of the recovered data bits into the output data stream in an order corresponding to the symbol stream.

19. The system of claim 12, wherein:
the first input data bits are even-numbered bits from the symbol stream; and
the second input data bits are odd-numbered bits from the symbol stream.

20. The system of claim 12, wherein the symbol stream is a differential quadrature phase shift keying (DQPSK) modulated data stream.

21. The system of claim 12, wherein the first and second input data streams comprise differential data streams.

22. The system of claim 12, further comprising one or more additional CDR circuits in addition to the first and second CDR circuits.

23. A system comprising:
means for:
receiving a first input data stream comprising first input data bits at an input frequency, the first input data stream having been sampled from a symbol stream;
generating a first recovered clock based on the first input data stream; and
retiming and demultiplexing the first input data bits from the first input data stream to generate n first recovered data streams each comprising first recovered data bits at a first divided clock having a first divided clock frequency that is less than the input frequency;
at a second CDR circuit:
receiving a second input data stream comprising second input data bits at the input frequency, the second input data stream having been sampled from the symbol stream;
generating a second recovered clock based on the second input data stream; and
retiming and demultiplexing the second input data bits from the second input stream to generate n second recovered data streams each comprising second recovered data bits at a second divided clock having a second divided clock frequency that is less than the input frequency;
means for determining a phase difference between the first recovered clock and the second recovered clock;
means for aligning the first recovered data bits from the first recovered data streams with the second recovered data bits from the second recovered data streams based at least in part on:
a value of n; and
the phase difference;
means for combining the first recovered data bits from the first recovered data streams with the second recovered data bits from the second recovered data streams to generate one or more output data streams; and
means for retiming the first and second recovered data bits in the one or more output data streams based on either the first recovered clock or the second recovered clock.

* * * * *